United States Patent [19]

Schneller et al.

[11] Patent Number: 4,678,737
[45] Date of Patent: Jul. 7, 1987

[54] RADIATION-SENSITIVE COMPOSITION AND RECORDING MATERIAL BASED ON COMPOUNDS WHICH CAN BE SPLIT BY ACID

[75] Inventors: Arnold Schneller, Mainz; Walter Herwig, Bad Soden; Kurt Erbes, Flörsheim, all of Fed. Rep. of Germany

[73] Assignee: Hoechst Aktiengesellschaft, Frankfurt am Main, Fed. Rep. of Germany

[21] Appl. No.: 931,986

[22] Filed: Nov. 25, 1986

Related U.S. Application Data

[63] Continuation of Ser. No. 703,404, Feb. 20, 1985, abandoned.

[30] Foreign Application Priority Data

Feb. 25, 1984 [DE] Fed. Rep. of Germany ....... 3406927

[51] Int. Cl.$^4$ ................................. G03C 1/76
[52] U.S. Cl. .................... 430/270; 430/191; 430/197; 430/273; 430/910
[58] Field of Search ............... 430/192, 197, 270, 273, 430/905, 910

[56] References Cited

U.S. PATENT DOCUMENTS

| | | | |
|---|---|---|---|
| 3,869,292 | 3/1975 | Peters | 430/192 |
| 4,250,247 | 2/1981 | Sander et al. | 430/270 |
| 4,387,152 | 6/1983 | Stahlhofen | 430/192 |
| 4,421,844 | 12/1983 | Buhr et al. | 430/326 |
| 4,457,999 | 7/1984 | Stahlhofen | 430/270 |
| 4,506,006 | 3/1985 | Rockert | 430/270 |

FOREIGN PATENT DOCUMENTS

| | | |
|---|---|---|
| 2322230 | 6/1981 | Fed. Rep. of Germany . |
| 0042562 | 12/1981 | Fed. Rep. of Germany . |
| 2718254 | 1/1984 | Fed. Rep. of Germany . |
| 2183748 | 12/1973 | France . |
| 0066452 | 12/1982 | France . |

OTHER PUBLICATIONS

*Chemical Abstracts,* Band 101, vol. 101, 1984, p. 610.

*Primary Examiner*—Jack P. Brammer
*Attorney, Agent, or Firm*—Schwartz, Jeffery, Schwaab, Mack, Blumenthal & Evans

[57] ABSTRACT

A radiation-sensitive composition is disclosed which comprises: (a) a polymeric binder comprised of an alkenyl phenol monomer; (b) a compound which forms a strong acid under the action of actinic radiation; and (c) a compound which contains at least one acid-cleavable C-O-C bond and has a solubility in a liquid developer which is increased by the action of acid. The composition yields positive-working recording layers which are more flexible than layers comprising known novolak binders.

9 Claims, No Drawings

RADIATION-SENSITIVE COMPOSITION AND RECORDING MATERIAL BASED ON COMPOUNDS WHICH CAN BE SPLIT BY ACID

This application is a continuation of application Ser. No. 703,404, filed Feb. 20, 1985, now abandoned.

BACKGROUND OF THE INVENTION

The present invention relates to a radiation-sensitive composition which comprises:

(a) a polymeric binder which is insoluble in water and soluble in aqueous-alkaline solutions;

(b) a compound which forms a strong acid under the action of actinic radiation; and (c) a compound which has at least onne C—O—C bond which can be split by acid, and which is suitable for use in the production of printing plates and photoresists.

Positive-working photosensitive compositions, i.e., compositions which comprise the above-mentioned constituents and are used to prepare photosensitive coatings which are rendered soluble in the exposed areas are known in the art.

The vast majority of these compositions contain phenolformaldehyde condensation products, particularly novolaks, as alkali-soluble binders. Other alkali-soluble binders which can be used and which are mentioned, for example, in German Pat. No. 2,718,254, include copolymers of maleic anhydride and styrene, copolymers of vinyl acetate and crotonic acid, copolymers of methyl methacrylate and methacrylic acid, and novolaks which have been modified by chloroacetic acid. For various well-known reasons, these copolymers are not preferred in the art. Virtually all known commercial products, therefore, contain novolaks. Novolaks used as binders, however, also have disadvantages for particular applications.

Due to the chemical constitution and the low molecular weight of novolak resins, which is predetermined by synthesis, these layers are relatively brittle. Accordingly, fractures of the layer often occur in the processing thereof, for example, when exposing the layer in contact with a mask or when laminating the layer as a dry resist to a support surface. This characteristic has a particularly adverse effect in the case of the relatively greater layer thicknesses which are preferred for dry resist materials.

In European Patent Application No. 0,042,562 a corresponding photosensitive composition is described which comprises, in addition to the alkali-soluble binder, another polymer, for example, a polyurethane, a polyvinyl alkylether, a polyalkylacrylate, or a hydrogenated colophony derivative, in order to increase the flexibility of the layer and improve other properties. But by adding these resins, which display the solubility behavior unlike that of novolaks, other properties, for example, developability, resistance of the printing stencils to acid or alkali are adversely influenced.

Other positive-working photosensitive compositions are known which contain o-quinone-diazides and novolaks. These compositions, which are widely used in the production of lithographic printing plates, also form relatively brittle layers. These photosensitive systems have also been combined with other alkali-soluble compounds in an attempt to modify particular properties. German Pat. No. 2,322,230, for example, describes a combination of different photosensitive compounds, for example, of o-naphthoquinone diazides, with polyvinyl phenols. The printing plates thus obtained have the advantages of an increased print run and an improved etch resistance. It is mentioned in the specification of the aforementioned German patent that plasticizers can be added to the layer, as is similarly done in the case of layers containing novolaks. To date, even these materials have not been adopted in practice.

The compositions comprising o-quinone diazides as photosensitive compounds have the disadvantage of a clearly lower photosensitivity, as compared with compositions comprising the above-mentioned compounds which can be split by acid. This has an unfavorable effect, particularly in applications requiring higher layer thicknesses, for example, in the dry resist process.

SUMMARY OF THE INVENTION

It is therefore an object of the present invention to provide radiation-sensitive compositions of the above-mentioned type which can be developed with aqueous-alkaline solutions and which form photosensitive layers of an increased flexibility, compared to layers comprised of known compositions.

It is another object of the present invention to provide a radiation-sensitive recording material which can be folded and otherwise manipulated without the recording layer of the material cracking, tearing or separating from its underlying support.

It is yet another object of the present invention to provide a process for the production of relief images, utilizing the above-mentioned radiation-sensitive recording material.

In accomplishing the foregoing objects, there has been provided, in accordance with one aspect of the present invention, a radiation-sensitive composition which comprises:

(a) a polymeric binder which is insoluble in water and soluble in aqueous-alkaline solutions;

(b) a compound which forms a strong acid under the action of actinic radiation; and (c) a compound which contains at least one acid-cleavable C—O—C bond and has a solubility in a liquid developer which is increased by the action of acid. In the aforesaid composition of the present invention, the binder comprises a polymer comprised of alkenyl phenol units.

In accordance with another aspect of the present invention, there has been provided a radiation-sensitive recording material comprising a support and a recording layer applied thereto, the recording layer comprising the radiation-sensitive composition described in the preceding paragraph. In one preferred embodiment, the aforementioned support comprises a flexible, transparent plastic film, and the recording layer has a free surface covered by a covering film and has a lower adhesion to the covering film than to the support.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

The preferred polymers for the binder of the present invention comprise monomeric units represented by the formula

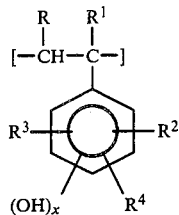

wherein
- R denotes a hydrogen atom, a cyanide group, an alkyl group or a phenyl group,
- $R^1$ denotes a hydrogen atom, a halogen atom, a cyanide group or an alkyl group,
- $R^2$, $R^3$ and $R^4$ each separately denote a hydrogen atom, a halogen atom, an alkyl group or an alkoxy group, and
- x stands for an integer from 1 to 3.

R prefereably is a hydrogen atom or an alkyl group which has from 1 to 4 carbon atoms, particularly a methyl group. $R^1$ is also preferably a hydrogen atom. If $R^1$ denotes an alkyl group, the latter may generally have from 1 to 4 carbon atoms, preferably 1 or 2 carbon atoms; it is, in particular, a methyl group.

It is preferred that at least one of the substituents $R^2$, $R^3$, and $R^4$ denote a hydrogen atom, and it is particularly preferred that at least two of these substituents be hydrogen atoms. If these symbols stand for alkyl groups or alkoxy groups, these groups appropriately have from 1 to 6, particularly from 1 to 3, carbon atoms. x preferably is less 3, in particular x=1.

If x=1, the hydroxyl group can be in any o-, m-, or p-position; in the case of disubstitution (x=2) and trisubstitution (x=3), it is also possible to have any combination of positions, preferably the m- and p-positions.

The positions for the radicals $R^2$, $R^3$, and $R^4$ are not specifically limited, but rather are determined by the positions of the hydroxyl groups.

Generally, any reference to "alkyl groups" herein is to be understood as denoting branched and unbranched, saturated and unsaturated groups which are cyclic or noncyclic, which can be substituted by halogen atoms or hydroxyl groups or can contain ether or keto groups. Unbranched hydrocarbon radicals having from 1 to 3 carbon atoms are preferred.

The polymers comprising units corresponding to formula I may be homopolymers which exclusively contain structural units according to formula I, or may be copolymers comprising monomers according to formula I and one or several other vinyl monomers.

The selection of suitable homopolymers or copolymers depends, in each individual case, on the intended application and on the type of the other components in the photosensitive layer. The hydrophilic character of the binder, for example, can systematically be controlled by the content of hydrophobic comonomers and can thus be adjusted to the other components. It is possible, moreover, to influence softening temperature by the selection of substituents for the aromatic moiety in formula I and, above all, by the selection of the comonomers.

The molecular weight of the homopolymers or copolymers, respectively, can be varied within wide limits; in the preferred polymers, $M_n=1,000-200,000$, particularly $M_n=5,000-100,000$. The hydroxyl number is generally in the range from 100 to about 450, preferably between 200 and 350.

The polymers can be prepared by mass polymerization, emulsion polymerization or solution polymerization of the corresponding monomers in the presence of cationic initiators, for example boron trifluoride etherate. It is also possible to effect radical polymerization of these monomers by the action of heat, radiation or initiators, for example, azo-bis-isobutyronitrile. Processes of this kind are described in *Journal of Polymer Science* A-1, 7, at pages 2175–2184 and 2405–2410 (1969).

The corresponding alkenyl phenols can be prepared, for example, by decarboxylation of hydroxycinnamic acids which, in turn, are obtained from substituted or unsubstituted hydroxybenzaldehydes and malonic acid. In addition, the alkaline decomposition of unsubstituted or substituted bisphenol A yields alkenyl phenols having a substituted α-carbon atom. It is also possible to dehydrate correspondingly substituted hydroxyalkyl phenols. Suitable preparation methods are described in *Journal of Organic Chemistry*, Vol. 23, pages 544–549 (1958) and in *Journal of Polymer Science* A-1, 12, pages 2017–2020 (1974).

As the comonomers for the alkenyl phenols or vinyl phenols, compounds of the general formula:

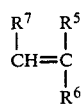

are preferred, wherein
- $R^5$ denotes a hydrogen atom, a halogen atom or an alkyl group,
- $R^6$ denotes an alkyl group, an alkoxy group, an alkyloxycarbonyl group, an acyl group, an acyloxy group, an aryl group, a formyl group, a cyanide group, a carboxyl group, a hydroxyl group or an aminocarbonyl group, and
- $R^7$ denotes a hydrogen atom or a carboxyl group, which may be linked with $R^6$ to form an acid anhydride if $R^6$ denotes a carboxyl group.

If $R^5$ or $R^6$ are alkyl groups, these generally have from 1 to 4 carbon atoms; representative examples of $R^6$ include an alkoxy group having from 1 to 8 carbon atoms, an alkyloxycarbonyl group having from 2 to 13 carbon atoms, an acyl group having from 2 to 9 carbon atoms, and an acyloxy group having from 2 to 5 carbon atoms. Aminocarbonyl groups may be unsubstituted or substituted by one or two alkyl groups having from 1 to 8 carbon atoms. The alkyl groups have the above-indicated signification.

Examples of formula II compounds include styrene, α-chlorostyrene, α-methylstyrene, 2-chloromethylstyrene, 3-chloromethylstyrene and 4-chloromethylstyrene, 4-bromostyrene; methyl vinyl ether, ethyl vinyl ether, propyl vinyl ether and butyl vinyl ether; acrylonitrile; acrolein; butadiene; acrylic acid, methacrylic acid, the methylesters, ethyl esters, propyl esters, butyl esters, pentyl esters, hexyl esters, hydroxyethyl esters and 2-ethylhexyl esters of the aforesaid acids; methacrylamide; acrylamide; vinylacetate; vinyl isobutyl ketone and maleic anhydride.

Examples of formula I copolymers which can be used in the present invention include:

(p-, m-, o-) vinyl phenol/styrene copolymers,
(p-, m-, o-) vinyl phenol/alkyl methacrylate copolymers,
(p-, m-, o-) vinyl phenol/alkyl acrylate copolymers,
(p-, m-, o-) isopropenyl phenol/styrene copolymers,
(p-, m-, o-) isopropenyl phenol/alkyl methacrylate copolymers,
(p-, m-, o-) vinyl phenol/maleic anhydride copolymers, and
isoeugenol/maleic anhydride copolymers.

The proportion of alkenyl phenol units in the copolymer depends on the other components of the composition and on the intended application. Usually, polymers containing from 20 to 100 mol-%, preferably from 40 to 90 mol-%, of alkenyl phenol units are used in the composition of the present invention.

In the preparation of the compositions according to the invention, the above-described binder is combined (a) with compounds containing at least one C—O—C bond which can be split by acid and (b) with substances which form acids upon exposure or by the action of high-energy radiation.

As the compounds which can be split by acid, the following are preferred:

(a) compounds which have at least one orthocarboxylic acid ester and/or carboxylic acid amide acetal group (these compounds can also have a polymeric character, and the aforementioned groups can be present as linking elements in the principal chain or as lateral substituents);

(b) oligomeric or polymeric compounds with recurrent acetal and/or ketal groups in the principal chain; and (c) compounds having at least one enolether or N-acyliminocarbonate group.

Compounds which can be split by acid, corresponding to type (a) above, and which are used as components of radiation-sensitive compositions, are described in detail in European Patent Application No. 0,022,571; compositions which contain compounds of type (b) are described in German Pat. Nos. 2,306,248 and 2,718,254; and compounds of type (c) are described in European Patent Application Nos. 0,006,626 and 0,006,627.

The type and the quantity of the binder and the cleavable compound can differ, depending on the intended use; preferably the binder is present in proportions ranging between 30% and 90% by weight, particularly between 55% and 85% by weight. The portion of the cleavable compound can be varied between 5% and 70% by weight, preferably between 5% and 40% by weight.

Numerous other oligomers and polymers can additionally be used, such as phenol resins of the novolak type and vinyl polymers, for example, polyvinyl acetals polymethacrylates, polyacrylates, polyvinyl ethers and polyvinyl pyrrolidones, which themselves can be modified by comonomers.

The most favorable proportion of these additives depends on the application-related requirements an on their influence on the conditions of development. Generally, the proportion does not exceed 40% of the alkenyl phenol polymer. To meet special requirements, such as flexibility, adhesion, glos, etc., the photosensitive layer can additionally contain small quantities of substances such as, for example, polyglycols, cellulose ethers, e.g., ethyl cellulose, wetting agents, leveling agents, dyes and finely divided pigments.

As the radiation-sensitive components which preferably form or eliminate strong acids when they are irradiated, a great number of known compounds and mixtures can be used, including diazonium, phosphonium, sulfonium and iodonium salts; halogen compounds; o-quinone diazide sulfochlorides and organo-metal/organohalogen combinations.

The above-indicated diazonium, phosphonium, sulfonium and iodonium compounds are generally employed in the form of their salts which are soluble in organic solvents, usually as the products resulting from separation with complex acids, for example, tetrafluoroboric acid, hexafluorophosphoric acid, hexafluoroantimonic acid and hexafluoroarsenic acid.

In principle, it is possible to use as halogen-containing radiation-sensitive compounds which form hydrohalogenic acid any organic halogen compounds which are also known as photochemical free-radical starters, for example, those which have more than one halogen atom on a carbon atom or in an aromatic ring. Examples of such compounds are described in U.S. Pat. No. 3,515,552; No. 3,536,489; and No. 3,779,778; in German Pat. No. 2,610,842 and in German Offenlegungschriften No. 2,243,621; No. 2,718,259; and No. 3,337,024. Of these compounds, the s-triazine derivatives containing two halogen methyl groups, in particular, trichloromethyl groups, and an aromatic or unsaturated substituent on the triazine nucleus, such as those described in German Offenlegungsschriften No. 2,718,259 and No. 3,337,024, are preferred. The action of these halogen-containing compounds can be spectrally influened and enhanced even by known sensitizers.

Suitable starters are, for example: 4-(di-n-propylamino)-benzene diazonium tetrafluoroborate, 4-p-tolylmercapto-2,5-diethoxy-benzene diazonium hexafluorophosphate and 4-p-tolylmercapto-2,5-diethoxy-benzene diazonium tetrafluoroborate, diphenylamine-4-diazonium sulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethyl-benzimidazole, 2-tribromomethylquinoline, 2,4-dimethyl-1-tribromoacetyl-benzene; 3-nitro-1-tribromoacetyl-benzene, 4-dibromoacetyl-benzoic acid and 1,4-bis-dibromoethyl-benzene; tris-dibromomethyl-s-triazine, 2-(6-methoxy-naphth-2-yl)-, 2-(naphth-1-yl)-, 2-(naphth-2-yl)-, 2-(4-ethoxyethyl-naphth-1-yl)-, 2-(benzopyran-3-yl)-, 2-(4-methoxy-anthrac-1-yl)-, 2-(4-styryl-phenyl)- and 2-(phenanthr-9-yl)-4,6-bis-trichloro-methyl-s-triazine; and the compounds specified in the examples.

The amount of starter can also vary widely, depending on the chemical nature of the starter and on the composition of the mixture. Favorable results are obtained using from about 0.1% to 10% by weight, preferably from 0.2% to 5% by weight, based on total solids. Especially in the case of photosensitive layers having thicknesses exceeding 10 μm, it is advisable to use a relatively small amount of acid donor.

The photosenstive composition can additionally be admixed with soluble or finely divided dispersible dyes and, depending on the intended purpose, also with UV absorbers. Dyes which have been found to be particularly useful are triphenylmethane dyes, in particular in the form of their carbinol bases. The most favorable quantitative proportions of the components can easily be determined by preliminary tests in each individual case.

Any materials which are conventionally employed in the technique of copying processes are suitable for use as supports for the photosensitive compositions. Examples of suitable supports include plastic films; insulation boards provided with a copper coating; and mechanically or electrochemically roughened and, if appropriate, anodically oxidized aluminum and wood, ceramics, glass, and silicon, the surface of which may have been chemically converted, for example, to form silicon nitride or silicon dioxide.

Preferred supports for layers exceeding 10 $\mu$m in thickness are plastic films which then serve as temporary supports for transfer layers. For this purpose, and also for color proofing films, polyester films, such as polyethylene terephthalate films, are preferred. It is, however, also possible to use polyolefin films, for example, polypropylene films. The supports used for layer thicknesses below about 10 $\mu$m are, in most cases, metals. Support materials which can be used for offset printing plates comprise: mechanically or chemically roughened and, if appropriate, anodically oxidized aluminum, which additionally may have been chemically pretreated, for example, with polyvinyl phosphonic acid, silicates or phosphates.

Coating may be effected directly or by transferal from a temporary support to circuit-board materials comprising insulating boards which have a copper coating on one or both sides, to glass or ceramic materials which may have been subjected to an adhesion-promoting pretreatment, and to silicon slices. It is also possible to coat wood, textiles, and the surfaces of a great number of materials which are advantageously image-exposed by projection and are resistant to the action of alkaline developers.

For drying after coating, customary equipment and conditions can be adopted, temperatures of about 100° C. and, for short periods, up to 120° C., being withstood without loss of radiation sensitivity.

The customary light sources, for example, fluorescent tubes, pulsed xenon lamps, metal halide doped high-pressure mercury vapor lamps, and carbon arc lamps may be used for exposure.

In this specification, the term "irradiation" pertains to the action of actinic electromagnetic radiation in the wavelength range below about 500 nm. Any radiation sources which emit in this wavelength range are basically suitable. It is particularly advantageous to use laser irradiation apparatus, in particular, automatic processing units, which are equipped with an argon ion laser as the radiation source. Irradiation can also be effected by means of electron beams. In this case, acid-forming compounds which, in the usual sense, are non-photosensitive, for example, halogenated aromatic compounds, and halogenated polymeric hydrocarbons can be used as the initiators of th solubilizing reaction. It is also possible to use x-rays for the image formation.

The imagewise exposed or irradiated layer can be removed in a known manner, using virtually the same developers as employed for developing commercial naphthoquinone diazide layers and photoresist compositions. Alternatively, the copying behavior of the novel materials of the present invention can advantageously be adjusted to the customary accessories, such as developers and program-controlled spray developing apparatus. The aqueous developer solutions can contain, for example, alkali metal phosphates, alkali metal silicates or alkali metal hydroxides and, in addition, wetting agents and, optionally, relatively small amounts of organic solvents. In particular cases, it is also possible to use solvent/water mixtures as developers. The most favorable developer can be selected by means of tests which are carried out with the layer used in each case. If required, development can be mechanically assisted.

When the photosensitive composition of the present invention is used in the production of printing plates, the developed plates can be warmed to elevated temperatures for a short period of time, as disclosed for diazo layers in British Published Application No. 1,154,749, in order to increase stability in the printing process and resistance to rinsing agents, deletion fluids and printing inks which are hardenable by ultraviolet light.

According to the present invention, a process for the production of relief images is also provided, in which a radiation-sensitive recording material comprising a support and a recording layer which comprises the above-defined radiation-sensitive composition is imagewise irradiated with actinic radiation to the extent that the solubility of the layer in an aqueous-alkaline developer solution is increased, and the irradiated areas of the layer are then removed by means of an aqueous-alkaline developer solution. In the process of the present invention, the recording layer contains a binder comprising a polymer comprised of vinyl phenol monomers.

By the present invention, positive layers are made available which have excellent flexibility, which adhere well to the substrate when they are processed in the form of a dry film, and which do not show any cracks or fractures, even at a relatively great layer thickness of about 20 to 100 $\mu$m and above. Above all, chipping off does not occur in the cutting procedure.

In the following examples, the process according to the present invention, and the preparation and application of the radiation-sensitive composition of the present invention, are illustrated. In the examples, percentages and quantitative ratios are understood as describing units by weight, unless otherwise indicated.

EXAMPLE 1

To produce an offset-printing plate, the following coating solution was prepared:

4 parts by weight of a copolymer of p-hydroxy styrene and butyl methacrylate (hydroxyl number 260; reduced specific viscosity 0.35 dl/g in dimethyl formamide), 1.2 parts by weight of a polyacetal, prepared from triethylene glycol and butyraldehyde, 0.05 part by weight of 2-(4-ethoxy-naphth-1-yl)-4,6-bis-trichloromethyl-s-triazine, 0.01 part by weight of crystal violet base, and 94.7 parts by weight of methyl ethyl ketone.

This coating solution was used to coat aluminum sheets which had been roughened by brushing. After drying, layer thicknesses ranging from 1.0 to 1.5 $\mu$m were obtained.

The sheets were exposed under a 5 kW metal halide lamp for 5 seconds and, following a delay of 10 minutes, were developed with the following solution:

5.3 parts by weight of sodium metasilicate.9H$_2$O, 3.4 parts by weight of trisodium phosphate.12H$_2$O, 0.3 part by weight of sodium dihydrogen phosphate (anhydrous), and 91.0 parts by weight of water.

In the developing process, the portions of the photosensitive layer which had been struck by light were removed, leaving the unexposed image areas on the support. A large print run was obtained from the printing plate prepared in this fashion.

EXAMPLE 2

To prepare a positive dry-resist:

40 parts by weight of a copolymer of 4-hydroxy-3 methoxystyrene and hexylmethacrylate (hydroxyl number 246; reduced specific viscosity 0.36 dl/g in dimethyl formamide), 11.7 parts by weight of a polyacetal prepared from triethylene glycol and butyraldehyde, 0.5 part by weight of 2-(4-ethoxy-naphth-1-yl)-4,6-bis-trichloromethyl-s-triazine, and 0.1 part by weight of crystal violet base were dissolved in 50 parts by weight of ethanol and 60 parts by weight of methyl ethyl ketone.

This solution was spin-coated upon a 26 $\mu$m thick, biaxially stretched and heat-set polyethylene terephthalate film, and then was post-baked for 10 minutes at 100° C. A layer thickness of 25 $\mu$m resulted. As a protection against dust and scratches, a polyethylene covering film was additionally laminated to the layer.

This dry-resist film exhibited an excellent flexibility. The resist film which was present on the support film was readily folded without giving rise to cracks or tears in the layer.

To produce printed-circuit boards, the covering film was peeled from this dry-resist film, and a commercial laminator was then used to laminate the dry-resist film to a cleansed, pre-warmed support which comprised an insulating material provided with a 35 $\mu$m thick copper coating on one or both surfaces. After the support film was peeled off and the material subjected to post-baking, the material was exposed under an original using a 5 kW metal halide lamp (distance 110 cm) for about 50 seconds and —following a delay of 10 minutes—developed for 1 minute in the developer indicated in Example 1. The resist stencil formed showed an excellent electroplating resistance, in particular when depositing an electroplate of copper and a Pb/Sn-alloy.

Plates treated in this manner could subsequently be exposed again and developed. After etching the bared copper, a printed-circuit board was obtained.

EXAMPLE 3

Example 2 was repeated, with a copolymer of 4-hydroxystyrene and 2-ethyl-hexylmethacrylate, having a hydroxyl number of 280 and a reduced specific viscosity of 0.478 dl/g in dimethyl formamide, being substituted for the copolymer of 4-hydroxy-3-methoxystyrene and hexylmethacrylate.

A positive-working dry-resist was obtained in this case, which also displayed excellent flexibility and adhesion to the copper substrate.

EXAMPLE 4

A coating solution composed of:

8 parts by weight of a copolymer of 4-isopropenylphenol and methylmethacrylate (hydroxyl number 310, reduced specific viscosity 0.189 dl/g in dimethyl formamide), 0.8 part by weight of a polymeric orthoester, prepared by condensing trimethyl orthoformate with 4-oxa-6,6-bis-hydroxymethyl-octan-1-ol, 0.03 part by weight of 2-(4-styrylphenyl)-4,6-bis-trichloromethyl-s-triazine, and 0.01 part by weight of crystal violet base in 180 parts by weight of methyl ethyl ketone, was coated upon an aluminum support which had been roughened with the aid of wire brushes, and was then dried. The photosensitive layer thus obtained had a layer weight of about 1.5 g/m$^2$.

The printing plate was exposed under an original for 5 seconds, using the light source mentioned in Example 1. When the printing plate was developed for 30 seconds with a solution comprising:

0.6% of NaOH, 0.5% of sodium metasilicate.5H$_2$O, and 1.0% of n-butanol in 97.9% of water, a clean copy of the original was obtained. The nonirradiated areas could be inked with a greasy ink, as is customary for offset-printing plates.

EXAMPLE 5

A photoresist solution was prepared from:

12.5 parts by weight of a copolymer of 4-hydroxystyrene and styrene (hydroxyl number 260; reduced specific viscosity 0.176 dl/g in dimethyl formamide), 2.1 parts by weight of a polyacetal of triethylene glycol and 2-ethyl-butyraldehyde, 0.1 part by weight of 2-(4-styryl-phenyl)-4,6-bis-trichloromethyl-s-triazine, and 0.05 part by weight of crystal violet base in 85 parts by weight of 2-ethoxy-ethylacetate.

The solution was then passed through a filter having a pore diameter of 0.2 $\mu$m (millipore).

The resist was spin-coated upon a wafer carrying a SiO$_2$ film, resulting in a layer thickness of 1.0 $\mu$m. Thereafter, a test-image mask was placed in initimate contact with the wafer, which was exposed for 15 seconds to ultraviolet light having a wavelength of 365 nm and an intensity of 4.5 mW/cm$^2$.

After a delay of 10 minutes, development was carried out for 40 seconds, using the developer of Example 1. The image pattern thus obtained showed a resolution of 1.0 $\mu$m.

EXAMPLE 6

A photoresist solution was prepared from:

55 parts by weight of a copolymer of 4-hydroxystyrene and hexylmethacrylate (hydroxyl number 290; reduced specific viscosity 0.55 dl/g in dimethyl formamide), 15 parts by weight of the polyacetal indicated in Example 5, 0.4 part by weight of 2-(4-ethoxy-naphth-1-yl)-4,6-bis-trichloromethyl-s-triazine, 0.07 part by weight of crystal violet base in 170 parts by weight of ethanol.

This solution was used to prepare a positive dry-resist film of 25 $\mu$m thickness, corresponding to Example 2. The dry-resist could be used to produce printed-circuit boards, in the above-described manner. The resist exhibited an excellent flexibility and a good adhesion to copper.

A dry-resist of the above-mentioned composition, in which the copolymer had been replaced by the same quantity of a novolak, showed formation of flakes and fractures upon cutting. Moreover, the resist layer frequently separated from the support when the covering film was peeled off.

EXAMPLE 7

In the following example, the suitability of the novel binders of the present invention for use in layers which are sensitive to electron beams is shown.

Layers which were applied in a thickness of about 1 μm to mechanically roughened aluminum and which were composed of:
parts by weight of the copolymer according to Example 6,
25 parts by weight of the bis-(5-butyl-5-ethyl-1,3-dioxan-2-yl)-ether of 2-butyl-2-ethylpropanediol, and
5 parts by weight of the triazine specified in Example 1 were irradiated with 11 kV electrons.

With a beam current of 5 μA, an irradiation time of 4 seconds was sufficient to solubilize an area of 10 cm$^2$, the developer of Example 1 having been allowed to act for 120 seconds; thus, a corresponding sensitivity for the above-mentioned layers of $74 \times 10^3$ disintegrations/s.cm$^2$ was observed.

EXAMPLE 8

A photoresist solution was prepared from:
10 parts by weight of a copolymer of isoeugenol and maleic anhydride (reduced specific viscosity: 0.343 dl/g in dimethyl formamide),
1.9 parts by weight of the polyacetal indicated in Example 1,
0.1 part by weight of 2-(4-styryl-phenyl)-4,6-bis-trichloromethyl-s-triazine, and
40 parts by weight of 1-methoxy-2-propanol.

The solution was then passed through a filter having a pore diameter of 0.2 μm. After the solution was spin-coated upon a wafer carrying a SiO$_2$ film, a layer thickness of 1.2 μm was obtained.

A test-image mask was thereafter placed in intimate contact with the wafer and exposure was carried out for 15 seconds, using ultraviolet light of 365 nm wavelength and having an intensity of 4.5 mW/cm$^2$. Following a delay of 10 minutes, development was effected for 30 seconds, using the developer of Example 1 (diluted 1:1 with H$_2$O). The resulting image pattern showed a resolution of 1.5 μm.

EXAMPLE 9

To produce thick resist layers, a solution was prepared from:
13.5 parts by weight of a copolymer of 3-hydroxystyrene and n-hexylmethacrylate (hydroxyl number 298; reduced specific viscosity 0.30 in dimethyl formamide),
5.8 parts by weight of a cresol-formaldehyde novolak (melting range 105°–120° C. according to DIN 53,181),
5.3 parts by weight of the polyacetal indicated in Example 1,
0.15 part by weight of 2-(3-methoxy-naphth-2-yl)-4,6-bis-trichloromethyl-s-triazine,
0.02 part by weight of crystal violet base, in
68.5 parts by weight of methyl ethyl ketone.

A biaxially stretched and heat-set, 26 μm-thick film of polyethylene terephthalate, which had been pretreated with a solution comprising trichloroacetic acid and polyvinyl alcohol, was coated with the above-described solution and then dried in such a manner that an 18 μm thick uniform resist layer was formed thereon.

To produce printed-circuit boards, this dry-resist was laminated to a pre-warmed support, as described in Example 2, and, then was exposed for 50 seconds under an original, using a 5 kW metal halide lamp. Following a delay of 10 minutes, development was carried out with a 1% strength NaOH solution.

The resulting image pattern exhibited an excellent adhesion and electroplating resistance. After the deposition of an electroplate of lead/tin and repeated differentiation and etching, printed-circuit boards were obtained.

EXAMPLE 10

A coating solution composed of:
20.0 parts by weight of a copolymer of 4-hydroxystyrene and n-hexylmethacrylate (hydroxyl number 309; reduced specific viscosity 0.289 dl/g in dimethyl formamide),
5.33 parts by weight of the polyacetal indicated in Example 1,
0.14 part by weight of the triazine indicated in Example 9,
0.02 part by weight of crystal violet base,
0.0025 part by weight of a modified silicone glycol, and
200 parts by weight of methyl ethyl ketone
was used to coat sheets of aluminum which had been roughened by brushing. After drying, layer thicknesses ranging from 1.0 to 1.5 μm were obtained.

The layer was distinguished by excellent leveling properties.

After exposure under an original, using the light source indicated in Example 1 and development with the developer mentioned in Example 1, a clean copy of the original was obtained. The non-irradiated areas could be inked with a greasy ink, and the printing plate thus produced could be used to print a great number of copies.

EXAMPLE 11

To prepare a positive dry-resist, a solution composed of:
10 parts by weight of a copolymer of 4-hydroxystyrene and butylacrylate (hydroxyl number 263; reduced specific viscosity 0.402 dl/g in dimethyl formamide),
2.1 parts by weight of the polyacetal indicated in Example 1,
0.1 part by weight of the triazine indicated in Example 4, and
0.015 part by weight of crystal violet base, in
30 parts by weight of methyl ethyl ketone
was spin-coated on a polyethylene terephthalate film as described in Example 2. The resulting dry-resist film had a very good elasticity.

This dry-resist film could be used to produce printed-circuit boards, in the manner described in Example 2.

What is claimed is:
1. A radiation-sensitive composition which comprises:
(a) from about 30 to 90% by weight of a polymeric binder which is insoluble in water and soluble in aqueous-alkaline solutions;
(b) from about 0.1 to 10% by weight of a compound which forms a strong acid under the action of actinic radiation; and
(c) from about 5 to 70% by weight of a compound containing at least one acid-cleavable C—O—C bond and having a solubility in a liquid developer which is increased by the action of acid, said polymeric binder comprising a copolymer comprised of

(i) 40 to 90 mol-% of alkenyl phenol units represented by the formula

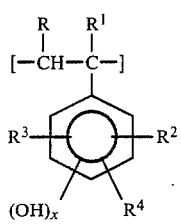 (I)

wherein

R denotes a hydrogen atom, a cyanide group, and alkyl group or a phenyl group, $R^1$ denotes a hydrogen atom, a halogen atom, a cyanide group or an alkyl group, $R^2$, $R^3$ and $R^4$ each separately denotes a hydrogen atom, a halogen atom, an alkyl group or an alkoxy group, and X stands for an integer from 1 to 3, and (ii) from 10 to 60 mol-% of units of alkyl acrylate or alkyl methacrylate.

2. A radiation-sensitive composition as claimed in claim 1, wherein said vinyl monomer is represented by the formula $$\begin{array}{c} R^7 \ \ R^5 \\ | \ \ \ \ | \\ CH=C \\ | \\ R^6 \end{array} \quad (II)$$

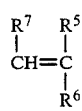

wherein $R^5$ denotes a hydrogen atom, a halogen atom or an alkyl group, $R^6$ denotes an alkyl group, an alkoxy group, an alkyloxycarbonyl group, an acyl group, an acyloxy group, an aryl group, a formyl group, a cyanide group, a carboxyl group, a hydroxyl group or an aminocarbonyl group, and $R^7$ denotes a hydrogen atom or a carboxyl group.

3. A radiation-sensitive composition as claimed in claim 1, wherein x is 1.

4. A radiation-sensitive composition as claimed in claim 1, wherein said compound (c) is a compound comprising at least one from the group consisting of an orthocarboxylic acid ester group, a carboxylic acid amide acetal group, an acetal group, an enolether group and an acyliminocarbonate group.

5. A radiation-sensitive composition as claimed in claim 1, wherein $R^1$ denotes an alkyl group comprising 1 to 4 carbon atoms.

6. A radiation-sensitive composition as claimed in claim 1, wherein at least one of $R^2$, $R^3$ and $R^4$ denotes hydrogen.

7. A radiation-sensitive composition as claimed in claim 1, wherein at least one of $R^2$, $R^3$ and $R^4$ denotes an alkyl or alkoxy group comprising 1 to 6 carbon atoms.

8. A radiation-sensitive composition which comprises a support and a recording layer applied to said support, said recording layer comprising:
(a) from about 30 to 90% by weight of a polymeric binder which is insoluble in water and soluble in aqueous-alkaline solutions;
(b) from about 0.1 to 10% by weight of a compound which forms a strong acid under the action of actinic radiation; and
(c) from about 5 to 70% by weight of a compound containing at least one acid-cleavable C—O—C bond and having a solubility in a liquid developer which is increased by the action of acid, said polymeric binder comprising a copolymer comprised of
(i) 40 to 90 mol-% of alkenyl phenol units represented by the formula

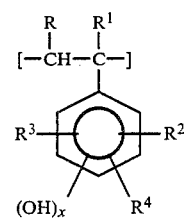 (I)

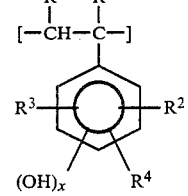

wherein

R denotes a hydrogen atom, a cyanide group, an alkyl group or a phenyl group, $R^1$ denotes a hydrogen atom, a halogen atom, a cyanide group or an alkyl group, $R^2$, $R^3$ and $R^4$ each separately denote a hydrogen atom, a halogen atom, an alkyl group or an alkoxy group, and X stands for an integer from 1 to 3, and (ii) from 10 to 60 mol-% of units of alkyl acrylate or alkyl methacrylate.

9. A radiation-sensitive recording material as claimed in claim 8, wherein said support comprises a flexible, transparent plastic film and wherein said recording layer has a free surface covered by a covering film, said recording layer having a lower adhesion to said covering film than to said support.

* * * * *